United States Patent [19]

Broyer et al.

[11] 4,429,454

[45] Feb. 7, 1984

[54] CONNECTOR TERMINAL SPREADER

[75] Inventors: Alfred P. Broyer, Hopatcong, N.J.; David R. Dines, Oklahoma City, Okla.

[73] Assignee: Western Electric Company, Inc., New York, N.Y.

[21] Appl. No.: 362,948

[22] Filed: Mar. 29, 1982

[51] Int. Cl.³ .......................... H01R 43/00; H05K 3/36

[52] U.S. Cl. .......................................... 29/747; 29/832

[58] Field of Search .......................... 29/832, 747, 760; 140/105, 147; 339/75 MP

[56] References Cited

U.S. PATENT DOCUMENTS

| | | | |
|---|---|---|---|
| 4,047,782 | 9/1977 | Yeager | 339/75 MP |
| 4,068,374 | 1/1978 | Coller | 29/747 |
| 4,159,154 | 6/1979 | Arnold | 339/75 MP X |
| 4,211,458 | 7/1980 | Kent | 339/75 MP X |
| 4,377,906 | 3/1983 | Bertellotti et al. | 29/747 |
| 4,377,907 | 3/1983 | Bertellotti et al. | 29/747 |

FOREIGN PATENT DOCUMENTS

| | | | |
|---|---|---|---|
| 197808 | 8/1978 | Canada | 29/747 |
| 74289 | 7/1978 | Japan | 29/747 |

*Primary Examiner*—William R. Briggs
*Attorney, Agent, or Firm*—R. P. Miller

[57] ABSTRACT

A connector (13) having two banks of terminals (16 and 17) is seated in a nest (27) located in a terminal spreading apparatus. A first spreader (36–37) overlies the first bank of terminals (17). A printed circuit board (10) with edge contact pads (12) is advanced along ways (98 and 99) to engage a roller (107) which thrusts a slide (48) toward the nest and then upwardly to move a second spreader (41–42) to engage and spread the banks of terminals (16 and 17). The connector body (14) tilts in the nest (27) to distribute the terminal spreading forces between the two banks of terminals.

13 Claims, 8 Drawing Figures

CONNECTOR TERMINAL SPREADER

FIELD OF THE INVENTION

This invention relates to a connector terminal spreader and, more particularly, to an apparatus for spreading two banks of projecting connector terminals to permit the insertion therebetween of an electrical device, such as a printed circuit board, with upper and lower edge contact pads.

BACKGROUND OF THE INVENTION

Many types of printed circuit boards are interconnected or connected to other electrical devices through the agency of connectors having projecting banks of terminals that overlay discrete contact pads formed along one or more edges of the circuit boards. With the advent of miniaturization and the consequent increase in circuit component density, more and more finite circuit paths are utilized that are terminated in closely spaced contact pads formed along both the upper and lower edge sections of the circuit boards. External connections from the board are made through banks of spaced pairs of terminals, thus necessitating the use of connectors with large numbers of closely spaced projecting flexible terminals. In order to assemble the connector in the board, considerable forces must be used, often resulting in bent terminals, gouged or marred contact pads, tangled terminals and misaligned terminals and corresponding contact pads.

In order to alleviate these problems, many diverse types of so-called zero force connectors have been developed. In these connectors complex mechanisms are built into the connector to forcibly spread the contact terminals prior to assembly of the connector and the circuit board. The mechanisms may be screw-operated, such as shown in W. C. Kent U.S. Pat. No. 4,211,458 issued July 8, 1980, or cam operated, such as shown in B. K. Arnold U.S. Pat. No. 4,159,154 issued June 24, 1979, or linkage operated, such as shown in M. L. Yeager U.S. Pat. No. 4,047,782 issued Sept. 13, 1977. In each instance, the terminal spreading facility is incorporated in the connector, thus resulting in complex structures of considerable cost. What is needed is a simple positive acting apparatus for spreading terminals on a succession of individual connectors to receive edge contact pads formed on printed circuit boards. Such an apparatus must be operable with a minimum of expenditure of energy and must not introduce any detrimental stresses, such that would permanently set the terminals in a distorted condition.

SUMMARY OF THE INVENTION

This invention contemplates, among other things, an apparatus for supporting a connector with two projecting banks of terminals in such a manner that a first spreader member overlies a first bank of the terminals, whereafter a second spreader member may be manipulated to engage and flex the second bank of terminals to tilt the connector so that the first bank of terminals are flexed against the first spreader member, thus spreading the terminals apart without introducing detrimental stresses.

More particularly, the apparatus features a nest for receiving a connector with a first bank of terminals positioned beneath a first fixed spreader member. A second spreader member is secured to a slide mounted on a pivot block. The pivot block is provided with a cutout section to cooperate with the nest to limit the extent of movement of the connector in the nest.

In use, the block is pivoted and the slide shifted to position the second spreader member in spaced alignment with the undersides of the second bank of contact terminals. The slide is then shifted to position the second spreader member underneath the second bank of terminals. An article, such as a printed circuit board, is moved toward the space between the terminals and engages an actuator mounted on the slide to pivot the slide and the pivot block so that the second spreader member engages and flexes the second bank of terminals. This action results in a slight tilting of the connector in the nest so that the first bank of terminals are flexed against the fixed first spreader member. In effect, the first and second terminal banks are spread apart with substantially uniform forces being applied to both banks of terminals. The printed circuit board may have a number of closely spaced contact pads formed on the leading edge of the board. The slide mounted second spreader member may be shifted, thus allowing the second bank of terminals to move into engagement with the contact pads on the circuit board. The released second spreader member and pivot block are moved to initial position to allow the withdrawal of the connector and the assembled printed circuit board from the apparatus.

BRIEF DESCRIPTION OF THE DRAWINGS

Other features and advantages of the present invention will be apparent upon consideration of the detailed specification and the drawings, wherein.

DETAILED DESCRIPTION

Figure 1:
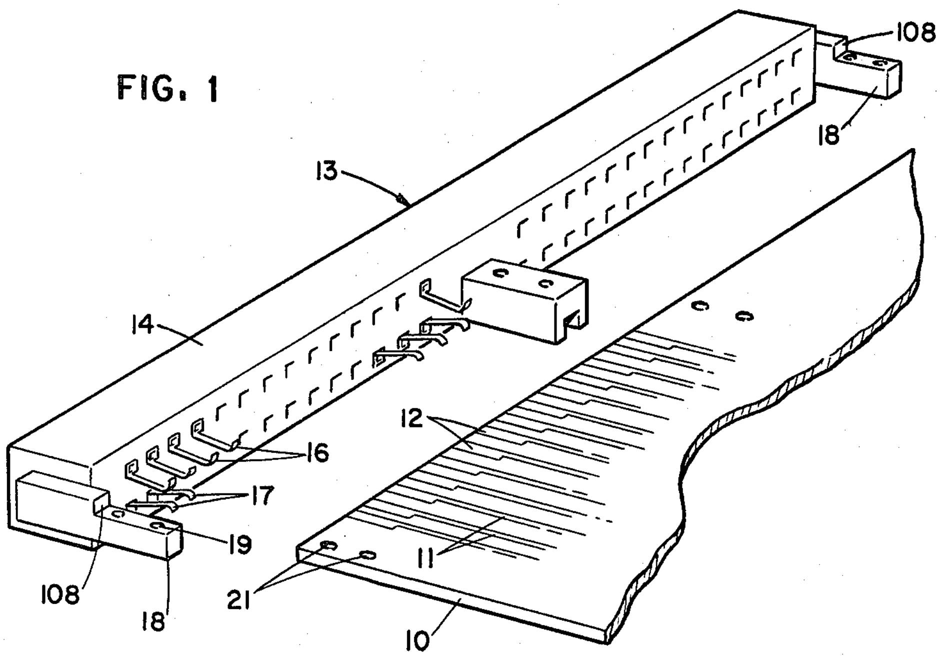
FIG. 1 is a perspective view of a connector having two rows of spring contact terminals which are to be assembled and placed on two rows of contact pads formed on upper and lower edge surfaces of a printed circuit board.

Referring to FIG. 1, there is shown a printed wiring board 10 having arrays of closely spaced printed circuit paths 11 on the upper and lower surfaces of the board. These circuit paths terminate in closely spaced edge contact pads or lands 12 formed along one forward edge of the upper and lower surfaces of the board. In order to connect the circuitry on the board 10 with the other circuit boards and equipments, connectors of the type denoted by the reference numeral 13 may be used. Connector 13 includes an elongated plastic body portion 14 of generally rectangular cross-sectional shape having two banks 16 and 17 of contact terminals projecting from one face thereof. The individual terminals are arcuate in shape and are set so that the terminals in the individual banks are aligned with each other.

The spacings between opposed aligned pairs of terminals in the respective banks are slightly less than the thickness of the board 10. The connector body may also include a number of projecting arms or legs 18 having holes 19 through which may be extended self-tapping screws to move within holes 21 formed in the board 10 so as to secure the connector the board. The lateral spacing of the contact pads 12 is selected to be the same as the spacing between adjacent terminals so that each pair of opposed terminals engage a pair of contact pads on opposite sides of the circuit board. The connector 13 is disclosed to illustrate the utility of the invention, and it is to be understood that many other types of connectors or electrical devices with banks of terminals or contacts may be utilized in practicing the invention.

When attempts are made to manually assemble the connector 13 on the board 10, a large physical force is required which is not evenly distributed resulting in frequent bendings of the terminals and misalignments of the terminals with the contact pads. Following such a manual assembly operation, each terminal position must be carefully checked and the individual bent terminals realigned to assure full contact between the individual terminals and the corresponding contact pads.

Figure 2:
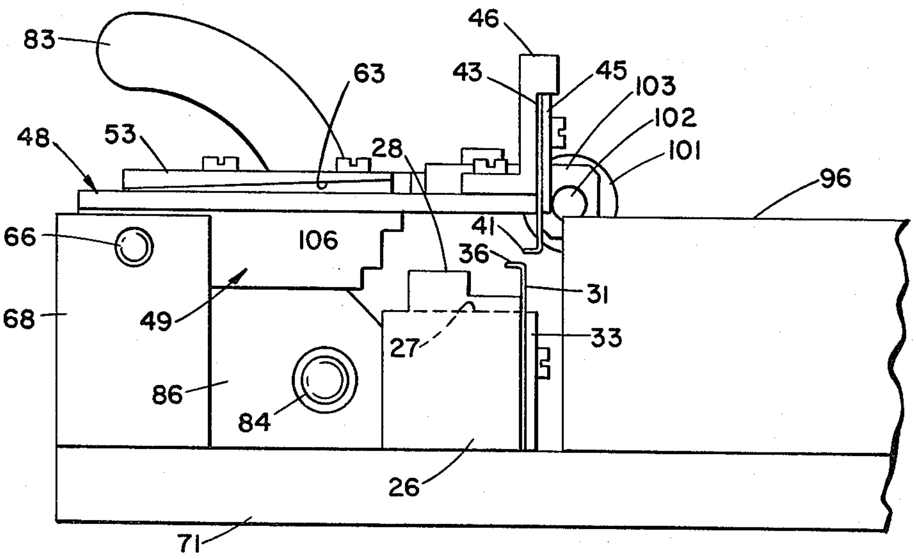
FIG. 2 is a side elevational view of a device for spreading the rows of spring contact terminals to permit the entry therebetween of the printed circuit board.

The assembly apparatus shown in the other figures is designed to spread the banks of terminals to permit the easy insertion of the circuit board so that the contact pads are positioned between corresponding upper and lower aligned terminals. More particularly, the apparatus (see FIGS. 2 and 4) comprises a block 26 having a cutout 27 that provides a nest to receive the body 14 of the connector 13. A pair of abutments 28 and 29 (see FIGS. 2, 3 and 4) extend upwardly at opposite ends of the block 26 to laterally position the connector body in the nest.

Figure 3:
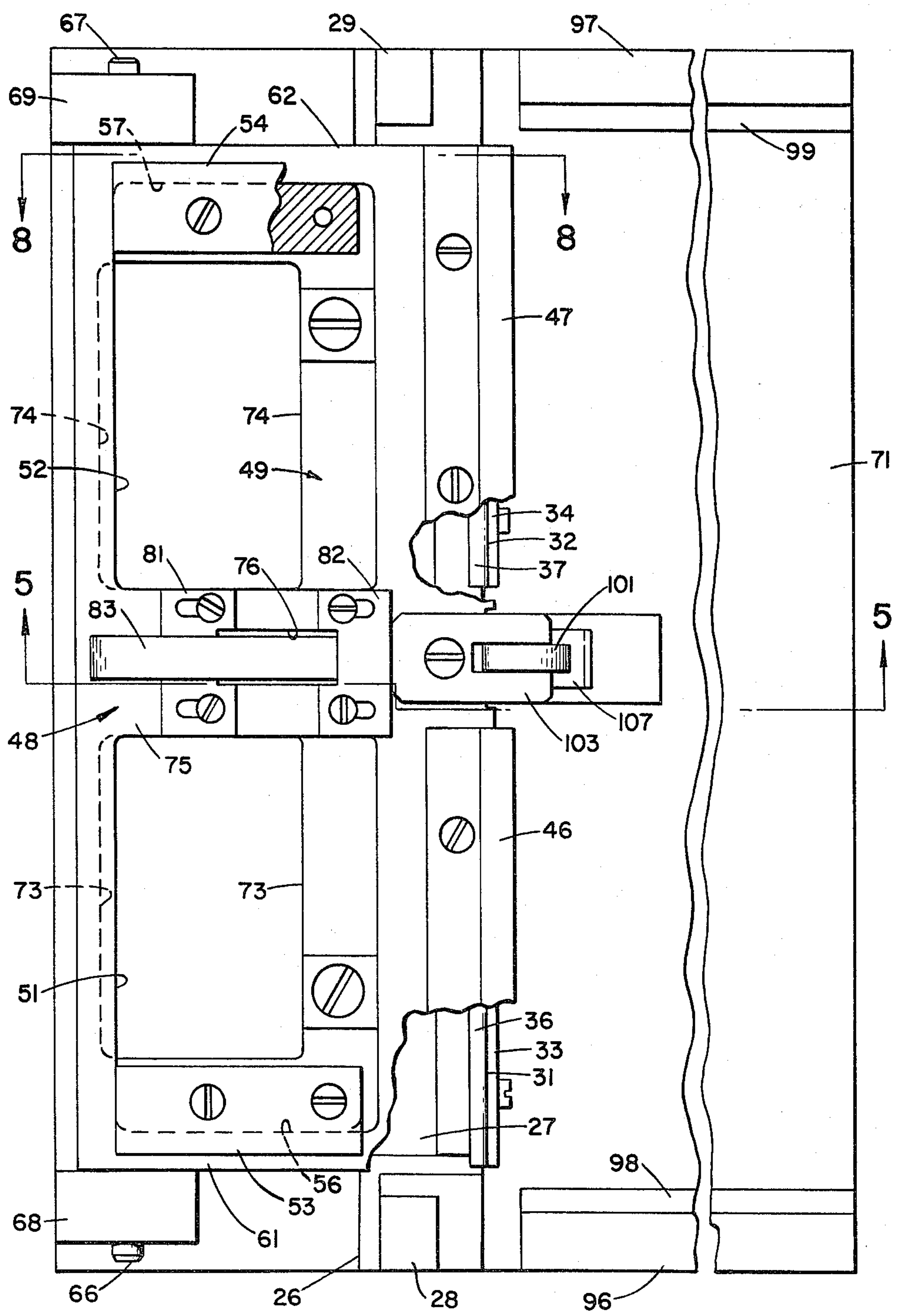
FIG. 3 is a top view of the apparatus shown in FIG. 2.
Figure 5:
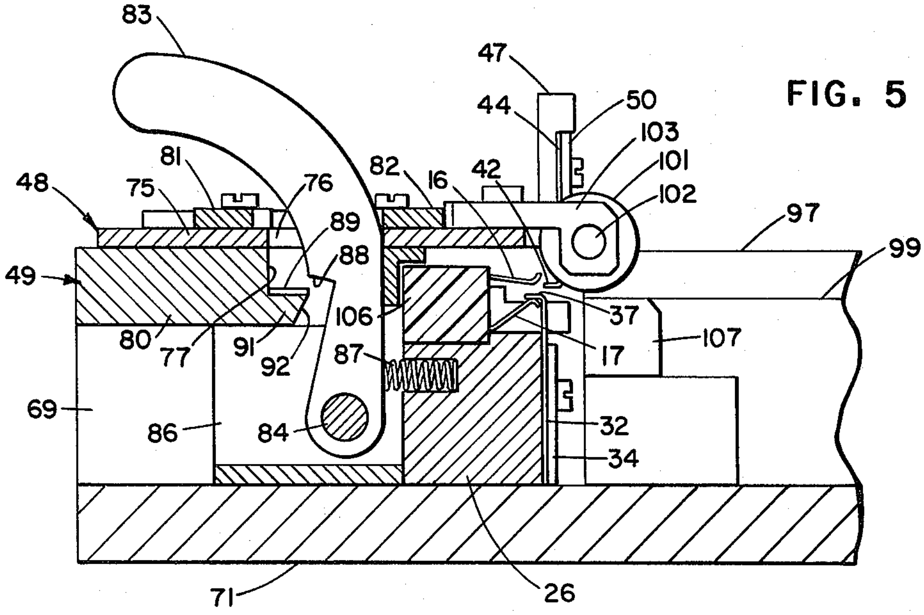
FIG. 5 is a view similar to FIG. 2 and is cut away to show the seating of the connector and the positions of a pair of spreader members in anticipation of a spreading of the spring contact terminals.
Figure 7:
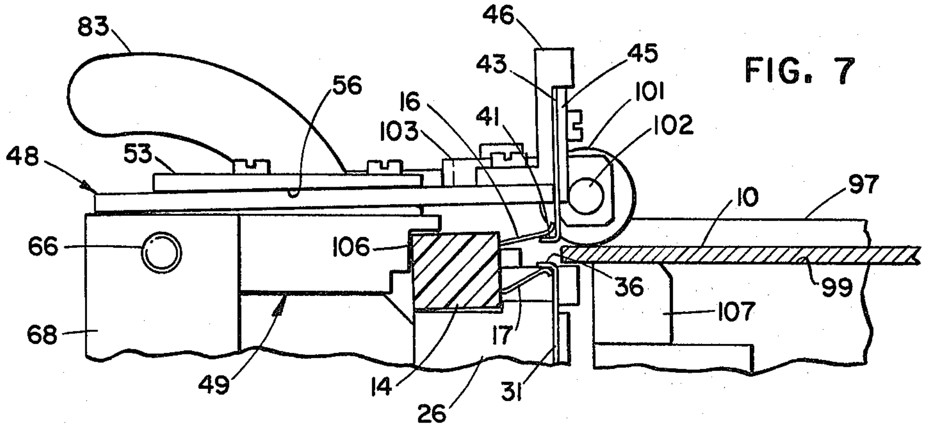
FIG. 7 is a view similar to FIG. 6 showing the positions of the spreader members immediately after a terminal spreading operation together with a showing of a printed circuit about to be inserted between the spread banks of terminals.
Figure 8:
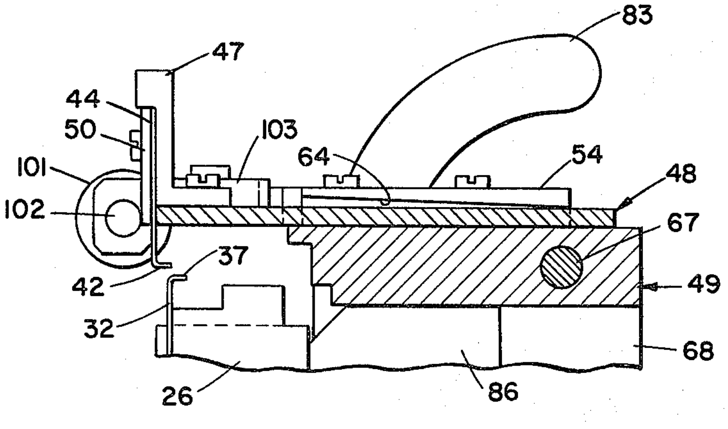
FIG. 8 is a partial section view taken along line 8—8 of FIG. 3 showing one of a pair of guideways that permits limited pivoting of a slide on which one of the terminal spreading members is mounted.

A pair of first spreader blades 31 and 32 are held against the front face of the block 26 by a pair of retainer members 33 and 34. Each of the blades 31 and 32 is bent inwardly to provide a pair of terminal spreader lips 36 and 37 which overlay and engage, or are slightly spaced (see FIG. 5) from, the lower bank of terminals 17 when a connector is placed in the nest. Positioned upwardly and to the right of the lips 36 and 37 (see FIGS. 2, 3 and 5) are a pair of laterally aligned lips 41 and 42 of a pair of second spreader blades 43 and 44. The blades 43 and 44 are secured by retainers 45 and 50 to uprights of right angle mounts 46 and 47. The horizontal legs of the mounts 46 and 47 are secured to a slide, generally designated 48, that rests on a pivot block generally designated 49. As shown in FIG. 3, the slide 48 is formed with a pair of rectangular openings 51 and 52. A pair of guide members 53 and 54 (see also FIGS. 2 and 7) are attached to the top surface of the pivot block 49. These guide members extend through the openings 51 and 52 in the slide 48 and are provided with guideways 56 and 57 to receive side arm sections 61 and 62 shaped by openings 51 and 52. Guide members 53 and 54 are formed with tapered ways 63 and 64 (see FIGS. 2 and 8), thus permitting the slide 48 to not only shift along the top surface of the block 49, but also to pivot slightly relative to the block 49.

The block 49 is provided with a pair of outwardly extending trunnions 66 and 67 (see FIGS. 2 and 3) which are fitted to rotate within bearings formed in or mounted on a pair of standards 68 and 69 extending upwardly from a base plate 71. The pivot block 49 is also provided with openings 73 and 74 (FIG. 3) that are generally aligned with the openings 51 and 52 formed in the slide 48. The openings formed in the slide 48 and the block 49 define center legs 75 and 80 (see FIGS. 3 and 4) which are provided with aligned rectangular slots 76 and 77, respectively. A pair of plates 81 and 82 with facing notches are secured to the slide 48 and may be adjusted toward and away from positions overlaying the slot 76 to vary the length of the slot that is exposed.

Figure 6:
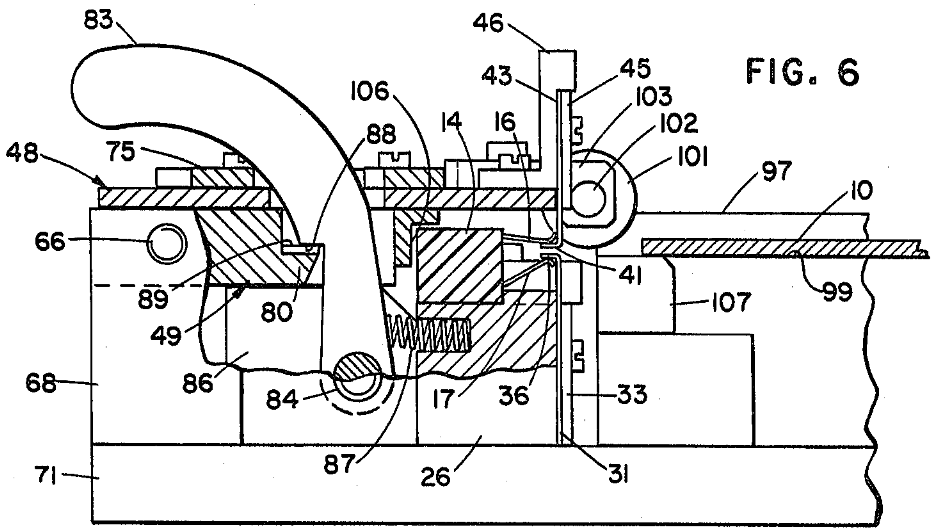
FIG. 6 is a view similar to FIG. 5 and shows the positions of a locked nest member and the spreader members immediately before a spreading operation.

Extending through the aligned slots 76 and 77 is a curved latch cam 83 that is lever mounted on a stud shaft 84 which projects into the arms of a clevis 86 (see FIG. 4) secured to the base 71. The lower section of the cam 83 is bored to receive a light spring 87 which projects into a bore formed in the nest block 26. The cam 83 is provided with a notched latching surface 88 (see FIGS. 5 and 6) that is adapted to move onto a flat latching surface 89 of a shoulder 91 formed on the center leg 80 of the pivot block 49. It will be noted that the forward face of the shoulder 91 is beveled to provide a surface 92 that is adapted to ride on the inner arcuate surface of the latch cam 83.

Mounted on the base plate 71 (see FIG. 3) are a pair of guide rails 96 and 97 having guideways 98 and 99 for supporting the printed circuit board 10. When a board is placed in the guideways 98 and 99 (see FIGS. 2, 6 and 7) and slid forwardly toward the nested connector 13, the forward end of the board will engage a roller or wheel 101. This roller is attached to a shaft 102 that extends into arms of a clevis 103 secured to the forward end of the slide 48.

In use of the apparatus, one of the standards 46 or 47 is grasped and moved upwardly to pivot (see FIG. 4) the slide 48 and the block 49 to expose the nest 27. A connector 13 is placed in the nest with the terminals 17 underlying the terminal spreader lips 36 and 37. Next, the slide 48 and block 49 are pivoted in a clockwise direction so that the beveled surface 92 of the block 49 rides on the inner surface of the cam 83 thus insuring that the cam is pivoted forwardly. The outer arcuate surface of the cam 83 rides on the forward edge of the slot 76 formed in the slide 48 and, thus, assures that the slide is moved into an extended right-hand position. The pivot block 49 (see FIG. 5) bottoms against the arms of the clevis 86 so that the shoulder 89 is positioned beneath the notch 88. One of the uprights of right mounts 46 or 47 may be grasped and shifted to the left to move the slide 48 and plate 82 to pivot the cam 83 with an assist from the light spring 87 in a counterclockwise direction, whereupon the latch surface 88 (see FIG. 6) is abutted against the flat latch surface 89. This movement of the slide 48 advances the spreader lips 41 and 42 beneath the upper bank of terminals 16.

In the alternative, the cam 83 may be grasped and moved in a counterclockwise direction with the assistance of the spring 87 to seat the latch notch 88 on the top latch surface of the shoulder 89. The inner arcuate surface of the cam 83 acts against the slide 48 to shift the slide leftwardly, whereupon the lips 41 and 42 are moved beneath the upper bank of terminals 16.

When the block 49 is pivoted toward the nest 27, a right angular notched surface or cutout 106 moves toward the body 14 of the connector. Inasmuch as the cam latch surface 88 engages the flat 89 on the pivot block 49, the pivot block is held against counterclockwise movement. However, the notched surface 106 is spaced from the connector body by an amount sufficient to permit a limited pivotal movement of the connector body within the nest before the upper surface of the connector body 14 is engaged and held by the notched surface 106.

A printed circuit board 10 is placed in guideways 98 and 99 and slid toward the roller 101. A transverse support block 107 is mounted on the base 71 and acts to support and align the forward edge of the board with respect to the spread apart banks of terminals. The forward edge of the circuit board with the contact pads 12 engages the roller 101 and rides beneath the roller toward the banks of terminals 16 and 17. If the lips 41 and 42 are not overlaying the upper banks of terminals, the engagement of the printed circuit board with the roller will act to shift the roller and attached slide 48 toward the left to move the upper spreader lips 41 and 42 into position beneath the upper bank of terminals 16. When the roller 101 is engaged, the slide 48 is pivoted upwardly a slight amount. This pivoting action of the slide 48 (see FIG. 7) relative to the block 49 is permitted by the tapered ways 63 and 64 formed in guide members 53 and 54. The spreader lips 41 and 42 engage and move the upper bank of terminals 16 upwardly. This movement will also pivot the connector body 14 in the nest 27 a slight amount so that the lower bank of terminals 17 are brought into engagement with and flexed by the spreader lips 36 and 37. It may be appreciated that the upward movement of the lips 41 and 42 results in a flexing of both banks of terminals thus distributing the separating forces between the two banks of terminals. The printed circuit board 10 is pushed to position the contact pads 12 in alignment with the corresponding terminals in the banks 16 and 17.

Figure 4:
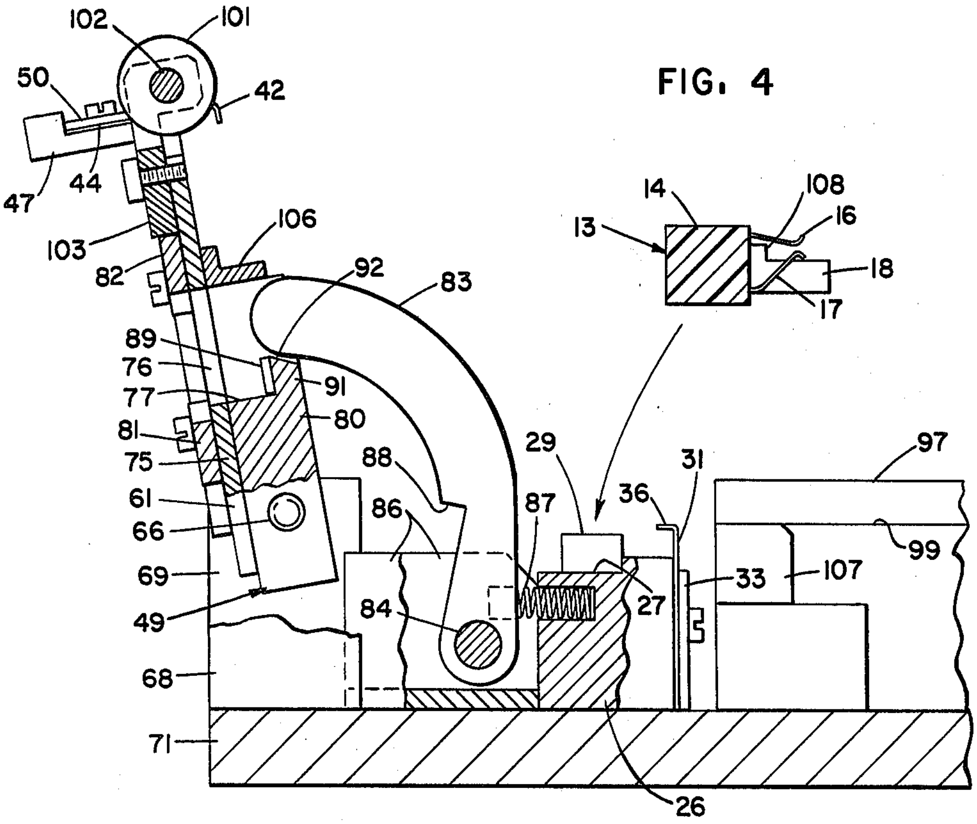
FIG. 4 is a view similar to FIG. 2 which is partially cut away to illustrate the placement of the connector in the apparatus.

Following the positioning of the forward edge of the board between the banks of terminals, one of the mount uprights 46 or 47 is grasped and thrust rightwardly toward the board to withdraw the lips 41 and 42 from engagement with the upper bank of terminals 16. The grasped upright is then moved upwardly so that the slide 48 and the block 59 pivot in a counterclockwise direction exposing the assembled connector in the nest. The arms 18 are positioned in overlaying relationship with the holes 21 formed in the board 10. Stop recesses on the connector arms 18 maintain hole alignment because the connector body is still retained in the nest while the lips 41 and 42 are withdrawn. Self-tapping screws are seated through the arm openings to secure the body of the connector to the circuit board. The assembled connector and circuit board may be shifted slightly to the left to withdraw the lower bank of terminals from beneath the spreader lips 36 and 37, and then lifted from the assembly apparatus. The rightward and subsequent pivoting movement of the slide 48 and the block 49 again positions the components of the assembly apparatus as shown in FIG. 4 in anticipation of the next connector assembly operation.

What is claimed is:

1. A connector terminal spreader, which comprises:
- a nest for supporting a connector;
- a first fixed spreader meaber extending toward the nest;
- a block;
- a slide mounted on the block;
- a second spreader member mounted on the slide;
- means for pivotally mounting said block and said slide to position said second spreader member in alignment with said nest; and
- means for moving said slide to advance said second spreader member toward the nest.

2. A connector terminal spreader as defined in claim 1, wherein said slide and block are formed with aligned slots; and said slide moving means comprises:
- a lever extending through the slots for moving the slide relative to the block to initially position the second spreader member in alignment with the nest and for then moving the positioned second spreader member toward the nest.

3. A connector terminal spreader as defined in claim 2, wherein the block has a first latching surface projecting into the slot formed in the block, and said lever has a latching surface cooperating with said first latching surface to lock said block against pivotal movement.

4. A connector terminal spreader as defined in claim 1, wherein said block has a cutout section movable into position to cooperate with the nest to limit movement of a connector supported in said nest.

5. A connector terminal spreader as defined in claim 1, which comprises:
- guide members mounted on the block having ways formed therein for guiding the slide for movement along the block and for permitting limited relative pivotal movement of the slide with respect to the block; and
- means on the slide for pivoting the slide relative to the block.

6. A connector terminal spreader as defined in claim 5, wherein the slide pivoting means comprises:
- a wheel mounted on the slide and positioned to be engaged by an article moved into the nest, whereupon the second spreader member is moved toward the nest and then pivoted away from the first spreader member.

7. An apparatus for spreading two spaced banks of flexible members projecting in generally common directions from an article, which comprises:
- a fixed nest for supporting an article with the banks of flexible members projecting therefrom;
- a first fixed spreader member projecting into said nest to overlay a first bank of flexible members projecting from an article supported in said nest;
- a second spreader member positionable in alignment with the nest and with the space between the flexible members extending from an article positioned in said nest;
- a slide for mounting said second spreader member to move into said nest and between a pair of flexible members projecting from said nest;
- a block for slidably supporting said slide;
- means mounting the block for pivotal movement to move the slide and position the spreader member in alignment with the nest and with the space between a pair of flexible members projecting from said nest; and
- means for shifting the slide and pivoting the block to move the second spreader member into the nest and then in a pivotal arc away from the first spreader to engage and flex the second bank of flexible members.

8. An apparatus as defined in claim 7, which includes:

means for supporting a second article for movement into the nest; and said slide shifting means comprises a member engageable by a second article moved into said nest.

9. An apparatus as defined in claim 7, wherein said block has a cut section cooperable with said nest to restrict the extent of movement of an article in the nest in response to said second spreader member engaging and flexing the second flexible members.

10. An apparatus as defined in claim 7, wherein said support block has a latching surface formed thereon; and a latch is provided to selectively engage said latching surface to hold said block and cutout section of the block against movement to limit the movement of an article positioned in the nest.

11. An apparatus for spreading two banks of terminals projecting in the same directions from the body of a connector, which comprises:

a nest for seating a connector with the banks of terminals projecting therefrom, said nest being constructed to permit limited pivotal movement of the connector therein;

a first fixed spreader member having a lip projecting therefrom to overlay a first bank of terminals projecting from a connector received in the nest;

a second spreader member having a lip for engaging the second bank of terminals; and means mounting the second spreader for movement to position the second lip in overlaying relation to the second bank of terminals, said mounting means also mounting the second spreader for movement away from the first spreader member to engage and flex the second bank of terminals and pivot the connector to move and flex the first bank of terminals against the lip on the first spreader member.

12. An apparatus for spreading a pair of parallel terminals extending from a connector, which comprises:

a nest for supporting the connector;

a first spreader member mounted to project in overlaying relation to a first terminal projecting from a connector supported in the nest;

a block having a cutout;

means for pivotally mounting said block for movement toward said nest to move the cutout section to cooperate with said nest to confine the connector to limited movement within the nest;

a slide mounted for movement along and with the block;

a second spreader member mounted on the slide for movement into underlaying relation with a second terminal projecting from a connector supported within the nest;

means for moving the slide along the block to position the second spreader member in underlaying relation with a terminal of a connector supported in the nest; and means for pivoting the slide and the block to engage the second spreader with the second terminal to pivot the connector in the nest to move and flex the first terminal against the first spreader member while the second spreader member flexes the second terminal.

13. An apparatus for spreading a pair of banks of terminals projecting from a connector to permit the insertion therebetween of a printed circuit board, which comprises:

a nest for supporting a connector with the terminals projecting from the nest;

a block with a cutout section and a latching surface;

means for pivotally mounting the block to move said cutout section to confine a connector within the nest;

a first spreader member having a first terminal spreader lip projecting toward said nest to overlay a first bank of terminals projecting from a connector supported in the nest;

a second spreader member having a second spreader lip;

a slide for mounting the second spreader member to move the second spreader lip toward said nest to overlay a second bank of terminals projecting from a connector supported in the nest;

means mounting said slide on the block for sliding movement relative thereto and for limited pivotal movement relative thereof;

a cam lever for shifting said slide as the block is pivoted to move the spreader member away from said nest;

said cam lever having a latching surface cooperable with said latching surface on the pivot block for holding said pivot block from pivotal movement and limiting the movement of a connector in the nest; and means on the slide for engaging a printed circuit board being moved into the nest for pivoting the slide to move the second spreader member to engage a second bank of terminals projecting from a connector supported in the nest.

* * * * *